(12) United States Patent
Knickerbocker et al.

(10) Patent No.: US 8,581,392 B2
(45) Date of Patent: Nov. 12, 2013

(54) SILICON BASED MICROCHANNEL COOLING AND ELECTRICAL PACKAGE

(71) Applicant: International Business Machines Corporation, Armonk, NY (US)

(72) Inventors: John Ulrich Knickerbocker, Monroe, NY (US); John H. Magerlein, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/708,499

(22) Filed: Dec. 7, 2012

(65) Prior Publication Data

US 2013/0092938 A1    Apr. 18, 2013

Related U.S. Application Data

(60) Continuation of application No. 13/365,505, filed on Feb. 3, 2012, now Pat. No. 8,421,220, which is a division of application No. 12/062,055, filed on Apr. 3, 2008, now Pat. No. 8,110,415.

(51) Int. Cl.
*H01L 23/34* (2006.01)

(52) U.S. Cl.
USPC .... 257/713; 257/712; 257/714; 257/E23.087; 257/E23.098

(58) Field of Classification Search
USPC ........... 257/712, 713, 714, E23.087, E23.098
See application file for complete search history.

(56) References Cited

U.S. PATENT DOCUMENTS

| | | | |
|---|---|---|---|
| 6,339,254 B1 * | 1/2002 | Venkateshwaran et al. | 257/686 |
| 7,058,247 B2 * | 6/2006 | Crow et al. | 385/14 |
| 2008/0128838 A1 * | 6/2008 | Theuss | 257/414 |
| 2010/0187682 A1 * | 7/2010 | Pinjala et al. | 257/713 |
| 2012/0249173 A1 * | 10/2012 | Hamel et al. | 324/755.01 |

* cited by examiner

*Primary Examiner* — Andy Huynh
(74) *Attorney, Agent, or Firm* — Michael J. Buchenhorner; Vazken Alexanian

(57) ABSTRACT

A chip package includes: a substrate; a plurality of conductive connections in contact with the silicon carrier; a silicon carrier in a prefabricated shape disposed above the substrate, the silicon carrier including: a plurality of through silicon vias for providing interconnections through the silicon carrier to the chip stack; liquid microchannels for cooling; a liquid coolant flowing through the microchannels; and an interconnect to one or more chip stacks. The chip package further includes a cooling lid disposed above the chip stack providing additional cooling.

17 Claims, 5 Drawing Sheets

SILICON BASED MICROCHANNEL COOLING AND ELECTRICAL PACKAGE

CROSS-REFERENCE TO RELATED APPLICATIONS

This application is a continuation of, and claims priority from, U.S. application Ser. No. 13/365,505 filed on Feb. 3, 2012; which application is itself a division of Ser. No. 12/062,055, filed on Apr. 3, 2008; which is incorporated by reference in its entirety herein.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of integrated circuit packaging and more particularly relates to the field of cooling devices for integrated circuits

BACKGROUND OF THE INVENTION

Current module cooling solutions remove heat primarily from the back of a chip or chip stack, limiting the amount of heat which can be removed. Furthermore, it is difficult with conventional test fixturing to provide adequate cooling and interconnection to chips and chip stacks with fine pitch interconnects during electrical testing.

Therefore, there is a need for a cooling device and process for cooling chips and chip stacks that overcomes the shortcomings of the prior art.

SUMMARY OF THE INVENTION

Briefly, according to an embodiment of the invention a method includes using a prefabricated shape with a silicon carrier to form both liquid cooling and electrical interconnection for integrated circuits.

According to another embodiment of the present invention, a chip package with an integrated cooling structure includes: a substrate; a plurality of conductive connections in contact with the silicon carrier; a silicon carrier in a prefabricated shape disposed above the substrate, the silicon carrier including: a plurality of through silicon vias for providing interconnections through the silicon carrier to the chip stack; a first set of liquid microchannels for cooling; a liquid coolant flowing through the microchannels; and an interconnect to one or more chip stacks. The chip package further includes a cooling lid disposed above the chip stack providing additional cooling. The cooling lid includes: a temporary seal attaching the cooling lid to the silicon carrier; and a second set of liquid microchannels aligned with the first set.

BRIEF DESCRIPTION OF THE DRAWINGS

To describe the foregoing and other exemplary purposes, aspects, and advantages, we use the following detailed description of an exemplary embodiment of the invention with reference to the drawings, in which.

Figure 1:
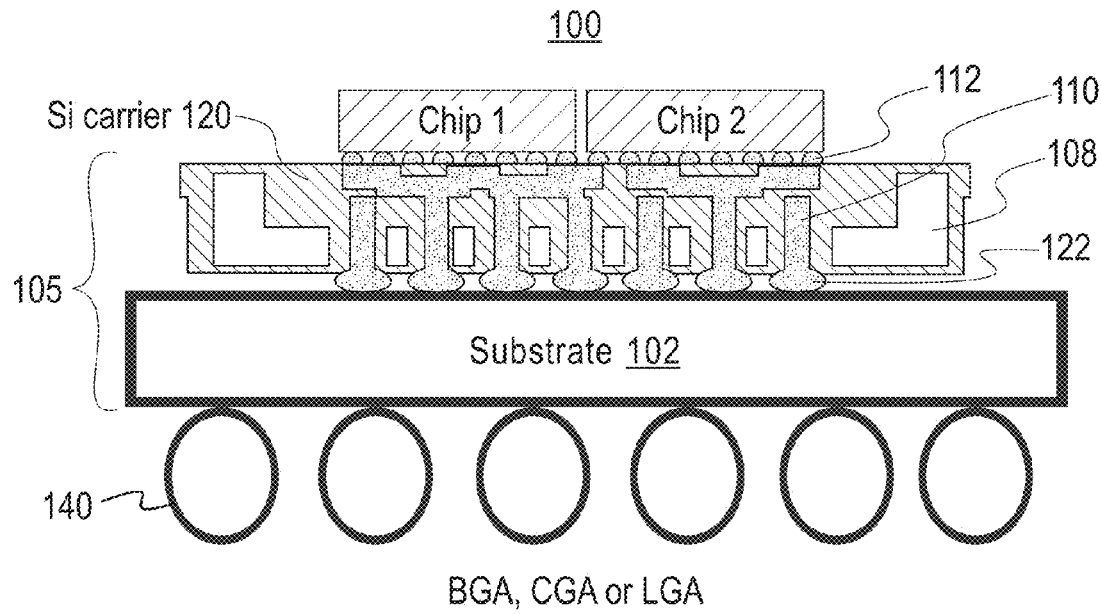
FIG. 1 shows a cross-section of a silicon carrier with multiple chips and with integrated electrical interconnection and microchannel liquid cooling, according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe an integrated silicon (Si) carrier that provides both microchannel cooling and electrical interconnections for integrated circuits. The silicon carrier includes electrical through vias, electrical wiring and an interconnection to chips made by means of metallic conductors such as solder and/or copper. The interconnections provide both electrical and thermal transport.

Additional thermal transport may be added, if required, by means of alternate or additional thermal paths off the chip or chip stack. The carrier can function as a permanent package to support chips and/or chip stacks as well as provide means for testing for known good chips where the silicon base acts to provide power and cooling.

A method according to an embodiment of the invention provides a way to remove heat effectively from a silicon carrier, which when used with small, high-conductivity balls or interconnects in the range of size from about 2.0 to 20 microns in diameter (for very high density interconnections) to about 50 to 100 microns in diameter (for lower density interconnections) as described herein provides an effective way to remove heat from the front as well as from the back of a chip or chip stack. This is useful both for chip testing and for chip operation in a final application.

The interconnections between the silicon carrier and the chips or chip stacks may have one or more size pads, or interconnections, such that small size interconnections may provide a means for electrical interconnections of signals, power and grounds (as well as enhance thermal conduction) and there may be other pads or large area interconnections which serve as an alternate means for heat transfer and may also be used for electrical interconnection. This method for fabricating the integrated carrier simplifies the methodology for assembly, test, and also reduces the hardware required in module assembly, as well as rework.

We describe a silicon package with electrical through silicon vias (TSV) and liquid cooling for one or more chips mounted on the surface and also for many layers of chips stacked with cooling only on periodic layers. The reason for this is that the use of liquid generally increases the thickness of the silicon layer and thus increases the electrical link path in that layer and this is not desirable for a high density stack of chip with high bandwidth interconnections.

Referring now in specific detail to the drawings, and particularly FIG. 1, there is illustrated an integrated circuit package according to an embodiment of the present invention. FIG. 1 is a simplified schematic of the structure of a silicon-based package. Shown is a cross-section of a package 100 that provides electrical interconnection for power (voltage and ground to the silicon chip) and for signals to the chips 1 and 2, between chips 1 and 2 on the silicon carrier 120, and off the silicon carrier 120 and provides for liquid cooling of one or more chips 1 and 2 on the silicon carrier 120. Note that for purposes of this disclosure, we use the term "chip" to encompass a single chip, chip stack, wafer, or stack of wafers.

The liquid cooling channels 108 (shown as a wave pattern) can be fabricated to permit liquid cooling across the silicon package 105. In addition, through-silicon-vias (TSV) 110 are introduced which provide vertical electrical interconnections. Note the through-silicon-vias 110 may take advantage of electrical isolation from the silicon carrier 120 by means of a dielectric layer between the silicon and a conductor, such as Tungsten (W) or Copper (Cu).

The silicon carrier 120 may also provide electrical wiring for a high bandwidth interconnection between chips 1 and 2, may provide integrated decoupling capacitors to support low inductance and close proximity capacitors to chips 1 and 2, and may provide active and/or passive circuits for voltage regulation, power inversion and/or other functions.

The silicon package 105 uses small, heat conductive interconnects 112 such as balls preferably made from copper or solder between the chips and the carrier 120. The balls 112 provide thermal as well as electrical transport. Additionally, balls 122 placed between the carrier 120 and the substrate 102 serve to further provide thermal and electrical transport.

The silicon carrier 120 may be mounted on another substrate 102 for improved mechanical integrity as well as providing a means for integration into a module, onto a board or socket by use of a ball grid array (BGA) 140, column grid array (CGA) or land grid array (LGA) interconnection. Cooling of the chips 1 and 2 may be done by means of heat removal from the back of the chips 1 and 2, by means of liquid cooling for heat removal from the silicon carrier, or by a combination of both.

Interconnections for liquid to remove heat from the silicon carrier 120 may be achieved by means of a connector, cap or lid (shown in FIG. 3) disposed over the chips 1 and 2 which connects by means of an adhesive (such as epoxy-based or silicon-based adhesive) or other means to channels, holes and or other liquid conduits created in the silicon carrier 120. A thermal enhancement material such as a thermal interface material (TIM), thermally conductive gel, solder or alternate thermal enhancement structure and method may be used to transfer heat from the chips 1 and 2 to the lid, cap or module, and/or between chips and the silicon package.

The TSV 110 and liquid channels 108 in the silicon carrier 120 may be formed by means of deep reactive ion etching or other means known in the art. In addition, the silicon package 100 may provide a means for not only electrical and thermal cooling but may also provide a means for optical interconnections (not shown) on or off module by use of vertical and/or horizontal channels or holes or other optical conduits.

Figure 2:
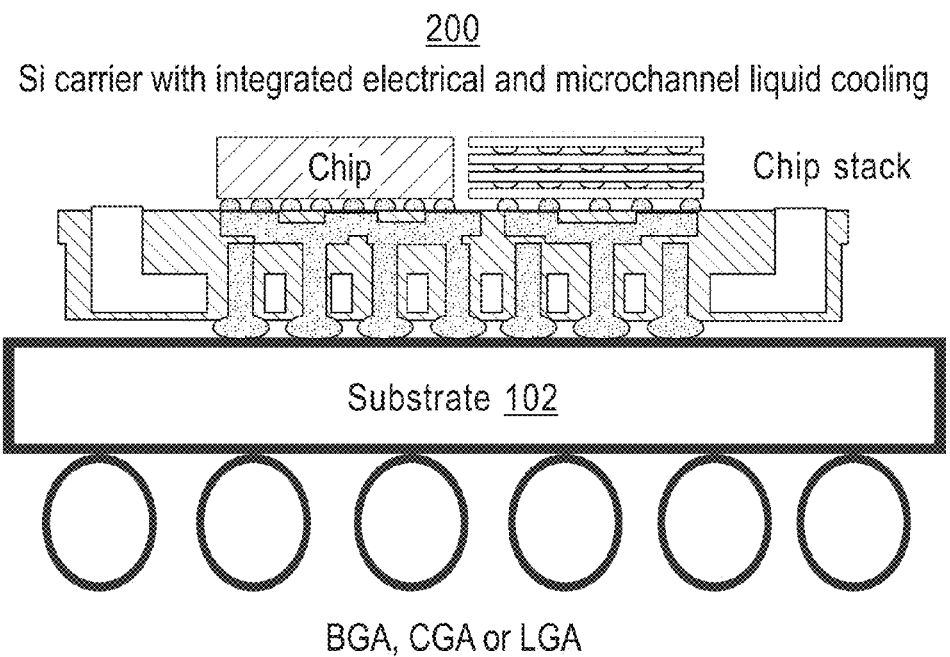
FIG. 2 shows a silicon carrier with a chip and a chip stack and with integrated electrical interconnection and microchannel liquid cooling, according to an embodiment of the present invention.

FIG. 2 shows a schematic cross-section of a silicon-based package 200 featuring integrated electrical and microchannel liquid cooling of stacked chips. The package of FIG. 2 provides electrical interconnection for power (voltage and ground to the silicon chips) and for signals to the chips and/or chip stacks, between chips and/or chip stacks, and off the silicon substrate and provides for liquid cooling of one or more chips and/or chip stacks on the silicon substrate 102.

Figure 3:
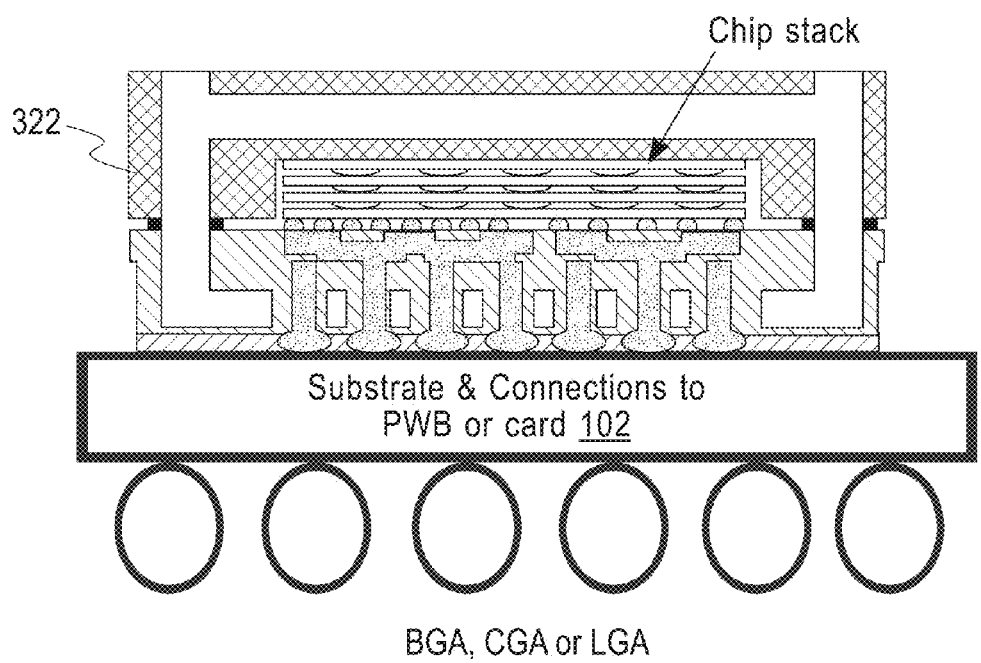
FIG. 3 shows one example of a silicon-based test head for chip stack testing at chip level assembly, according to an embodiment of the present invention.

Referring to FIG. 3 there is shown a silicon-based test platform substrate with an integrated cooling structure. This provides socket testing for chip stacks or chip stacks on a module. Liquid cooling provides cooling during test by means of liquid flow through the lid 322 and silicon carrier 120. Note the temporary seal between the lid 322 and the silicon package may be a rubber or polymer "O" ring to seal a liquid connection between the lid 322 and the silicon carrier 120. An adhesive may be used from the silicon carrier 120 to the substrate 102 for improved mechanical integrity of the silicon package 105. Power, ground, and signals for testing can be provided with active circuits in the silicon package 105 and/or by means of electrical interconnections through the supporting substrate and/or board interconnections.

Figure 4:
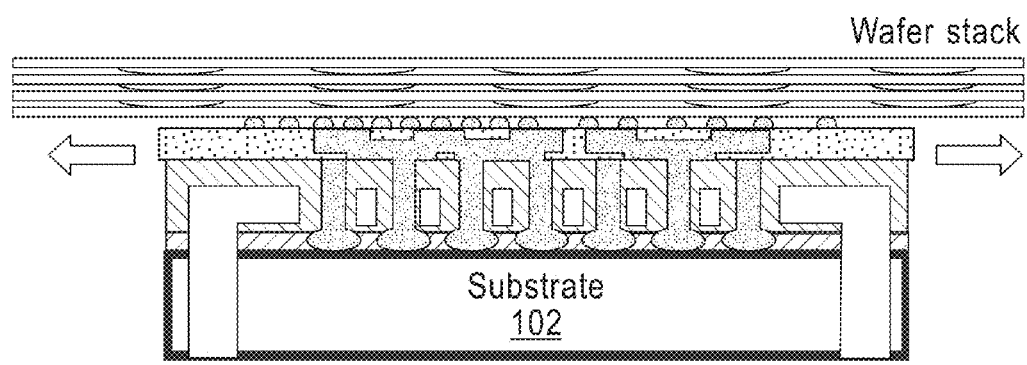
FIG. 4 shows an example of a silicon-based test head probe for chip stack testing at wafer level, according to an embodiment of the present invention.

Referring to FIG. 4 there is shown a silicon test head probe that provides means for electrical test and cooling of wafers or wafer stacks with integrated liquid cooling in a silicon based package.

Figure 5:
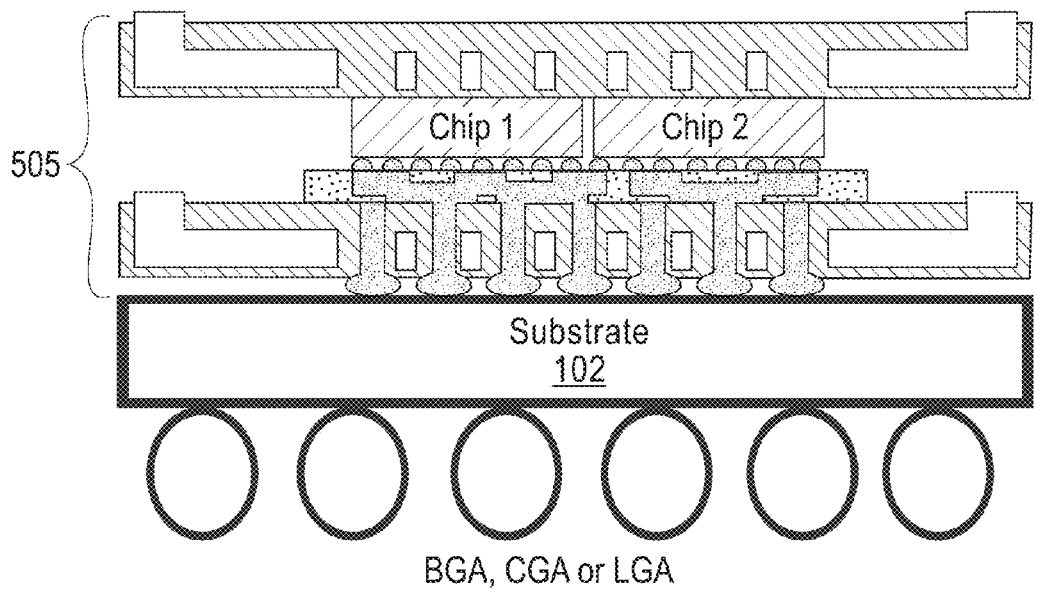
FIG. 5 shows a silicon-based carrier providing cooling to both the top and bottom of a chip, according to an embodiment of the present invention.

Referring to FIG. 5 there is shown a silicon-based package 505 which can provide electrical and liquid cooling to one or more chips 1 and 2 (shown) from both sides of the chips 1 and 2. The structure 505 can also provide electrical and liquid cooling to chips and/or chip stacks where liquid cooling may be critical in cooling chip stacks from the top and bottom of the chip stacks as well as power delivery and signal transmission may be critical from one or both top and bottom of the chip stacks.

Figure 6:
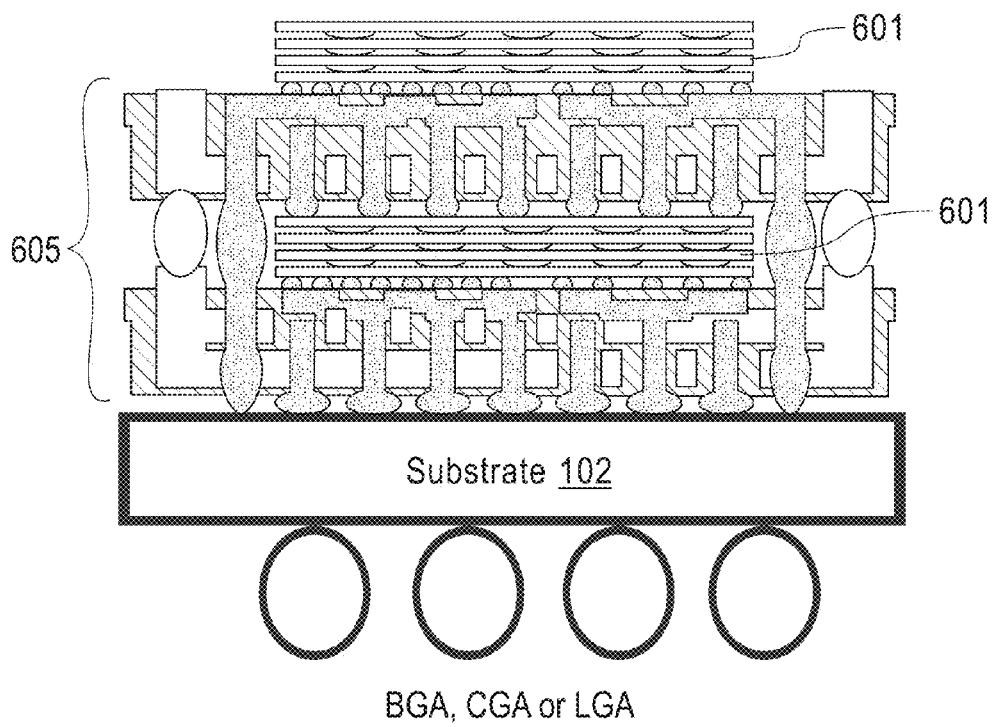
FIG. 6 shows an example of a silicon-based carrier on a segmented platform, according to an embodiment of the present invention.

Referring to FIG. 6 there is shown a structure wherein a silicon-based package 605 provides a segmented platform to provide electrical power, voltage and signal transmission to one or more chip stacks 601 as well as liquid cooling for the chip stacks 601. These units 605 may be stacked for power delivery, signal transmission and cooling within the stacked chips and package structures, as shown. In addition, but not shown, optical interconnections may also be provided by means of the silicon package 605.

Figure 7:
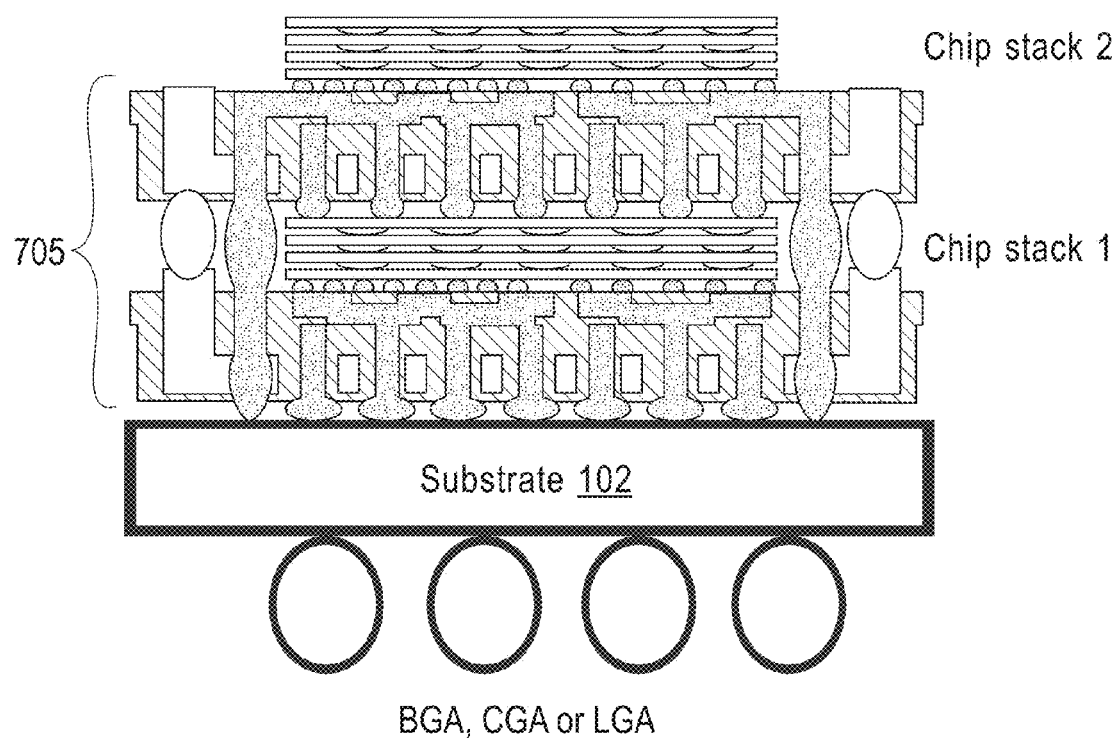
FIG. 7 shows another example of a silicon-based test head for chip stack testing at chip level assembly, according to an embodiment of the present invention.

Referring to FIG. 7 there is shown an example of a test head, probe or socket which can be utilized to test stacked chips 1 and 2, along with silicon packages 705 which provide electrical power, signal transmission and cooling for the assemblies in stacked configurations.

Figure 8:
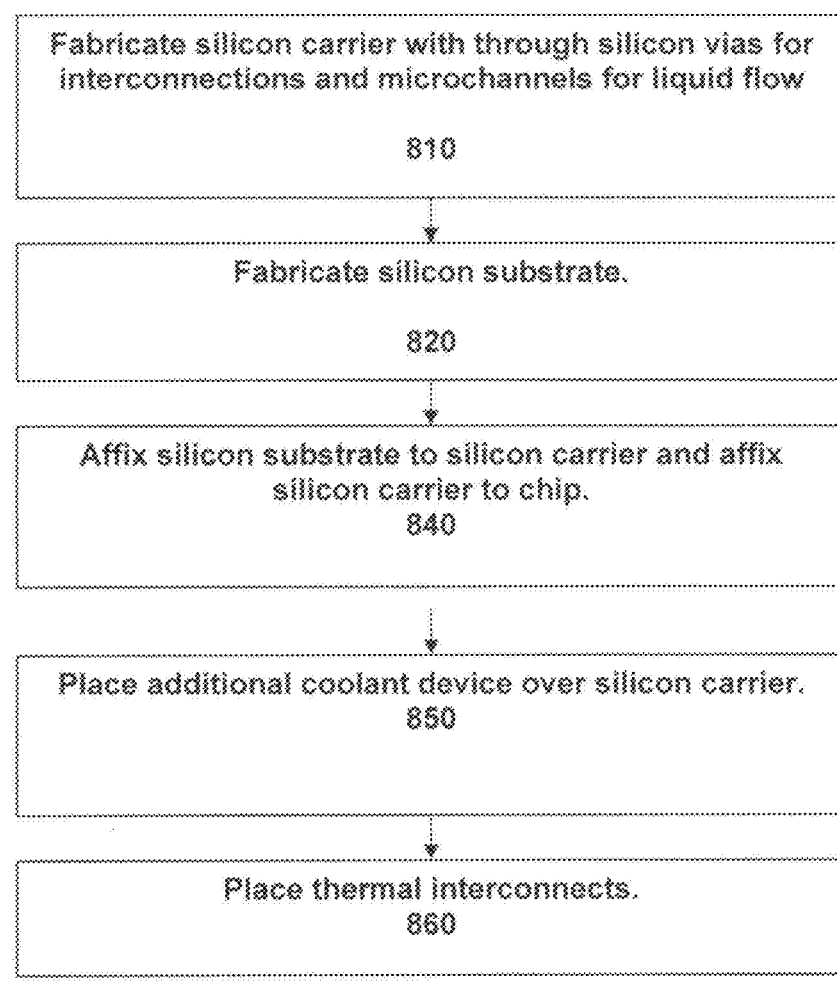
FIG. 8 shows a flow chart of a method for producing a silicon-based chip package, according to an embodiment of the present invention.

Referring to FIG. 8 there is shown a high-level flow chart 800 of a method for producing a coolant device according to an embodiment of the present invention. In step 810 the silicon carrier 120 is fabricated with through-silicon-vias 110 and microchannels 108 for liquid coolant. The through-silicon-vias 110 can accommodate electrical conduits or optical interconnects. The vias 110 run through the carrier to make contact with the chip 1.

Next, in step 820 the substrate 102 is fabricated. Note the order of steps 810 and 820 can be switched. In step 840 we affix the substrate 102 to the silicon carrier 120 and affix chips to the silicon carrier.

In step 850, once the chips are positioned, we place an additional coolant device above them. This coolant device may be a cap 322 or another carrier 520. Note that the additional carrier 520 should also be pre-fabricated with through-silicon-vias 110 and microchannels 108 in order to further enhance cooling. Step 850 may be repeated with additional layers of carrier 520, chip 1, and additional carrier 520.

In step 860 we place a ball array 140 between the substrate 102 and a printed circuit board or other surface.

While typically only about 5% of the heat from the chip travels from the chip through the C4's (controlled collapse chip connections) into the first level package, it is possible to greatly increase the amount of heat removed from the front of the chip by using smaller metal balls 112 with better thermal conductivity and by providing a way to remove heat from the first level package. For example, if there were a 25% coverage of copper balls 25 microns high between the chip and the first level package, the area normalized thermal resistance (Rth) would be $$Rth = 25 \times 10\text{--}6 \ m/(0.25 \times 390 \ W/m\text{--}K) = 0.25 \ K\text{--}mm2/W$$

Even after adding the thermal resistance of the chip wiring/insulation layers, the thermal resistance could be less than or comparable to that for removing heat from the back of the chip. This invention describes a way to remove heat effectively from a silicon carrier, which when used with small, high-conductivity balls as described here, can provide a way to effectively remove heat from the front of the chip as well as from the back. This can be useful both for chip testing and for chip operation in a final application.

Therefore, while there has been described what is presently considered to be the preferred embodiment, it will understood by those skilled in the art that other modifications can be made within the spirit of the invention.

The invention claimed is:

1. A chip package with an integrated cooling structure comprising:
 a silicon-based substrate;
 an integrated cooling structure coupled with the silicon-based substrate, said integrated cooling structure comprising:
 a silicon carrier for a chip stack in a prefabricated shape disposed above the substrate, the silicon carrier comprising:
 a first array of small, highly thermally conductive metallic balls from 2.0 to 20 microns in diameter between the silicon carrier and the substrate;
 a plurality of chip stacks;
 a plurality of through silicon vias providing electrical interconnections through the silicon carrier to the chip stacks;
 a first set of liquid microchannels cooling the chip stacks;
 a liquid coolant flowing through the first set of liquid microchannels; and
 a second array of small, highly thermally conductive metallic connections attaching the plurality of chip stacks to the silicon carrier; and
 a cooling lid disposed above the plurality of chip stacks, said cooling lid comprising:
 a temporary seal attaching the cooling lid to the silicon carrier; and
 a second set of liquid microchannels for cooling, said second set aligned with the first set at each end of the cooling lid such that liquid is able to flow between said cooling lid and the silicon carrier without impedance when said cooling lid is attached.

2. The chip package of claim 1 wherein the interconnection to the chip stacks provides both electrical and thermal transport and comprises metallic conductors.

3. The chip package of claim 1 wherein the plurality of through silicon vias are formed by etching into the silicon carrier.

4. The chip package of claim 1 wherein the first set of liquid microchannels is formed by etching into the silicon carrier.

5. The chip package of claim 1 further comprising a dielectric layer in the silicon carrier disposed between the silicon carrier and the plurality of through silicon vias.

6. The chip package of claim 1 wherein the the first array comprises an array selected from a group consisting of:
 copper to copper interconnections;
 metallic interconnections;
 solder micro-joints;
 controlled collapse chip connections;
 thin height, large area connections;
 an array of connections of equal size; and
 a combination of smaller thin connections and large area thin interconnections.

7. The chip package of claim 1 wherein the substrate is attached to a card, board, or other surface with an area array selected from a group consisting of:
 a ball grid array;
 a column grid array;
 a pin grid array;
 a land grid array; and
 a high density connector.

8. The chip package of claim 1 further comprising a thermal interface material disposed between the cooling lid and the plurality of chip stacks to transfer heat from the chip stacks.

9. The chip package of claim 8 wherein the thermal interface material is further disposed between the plurality of chip stacks and the silicon carrier.

10. The chip package of claim 1 wherein the plurality of through silicon vias provide electrical interconnections.

11. The chip package of claim 10 wherein the electrical interconnections are vertical.

12. The chip package of claim 1 wherein the cooling lid may also provide electrical interconnection to the plurality of chip stacks for power delivery and signal interconnection.

13. The chip package of claim 1 wherein the plurality of through silicon vias provide optical interconnections.

14. The chip package of claim 1 wherein the temporary seal comprises an o-ring sealing a liquid connection between the cooling lid and the silicon carrier.

15. The chip package of claim 14 wherein the o-ring is formed of rubber.

16. The chip package of claim 1 further comprising an adhesive applied between the silicon carrier and the substrate, said adhesive providing improved mechanical integrity of said chip package.

17. The chip package of claim 1 further comprising: active circuits in the silicon carrier providing power, ground and signals for testing.

* * * * *